United States Patent
Kato et al.

(10) Patent No.: US 9,627,759 B2
(45) Date of Patent: Apr. 18, 2017

(54) ANTENNA DEVICE ANTENNA MODULE

(71) Applicant: Murata Manufacturing Co., Ltd., Nagaokakyo-shi, Kyoto-fu (JP)

(72) Inventors: Noboru Kato, Nagaokakyo (JP); Takashi Noma, Nagaokakyo (JP); Kuniaki Yosui, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 293 days.

(21) Appl. No.: 14/224,104

(22) Filed: Mar. 25, 2014

(65) Prior Publication Data

US 2014/0203986 A1 Jul. 24, 2014

Related U.S. Application Data

(63) Continuation of application No. PCT/JP2013/050157, filed on Jan. 9, 2013.

(30) Foreign Application Priority Data

Jan. 10, 2012 (JP) ................. 2012-002221

(51) Int. Cl.
*H01Q 7/00* (2006.01)
*H01Q 1/40* (2006.01)
(Continued)

(52) U.S. Cl.
CPC ......... *H01Q 7/00* (2013.01); *G06K 19/07783* (2013.01); *H01Q 1/40* (2013.01); *H01Q 7/06* (2013.01); *H01Q 23/00* (2013.01)

(58) Field of Classification Search
CPC ....................................................... H01Q 7/00
(Continued)

(56) References Cited

U.S. PATENT DOCUMENTS

| 2009/0040734 A1 | 2/2009 | Ochi et al. |
| 2012/0206239 A1* | 8/2012 | Ikemoto ............ G06K 7/10346 340/10.1 |
| 2014/0203986 A1 | 7/2014 | Kato et al. |

FOREIGN PATENT DOCUMENTS

| CN | 101401114 A | 4/2009 |
| GB | 2470113 A | 11/2010 |

(Continued)

OTHER PUBLICATIONS

Official Communication issued in International Patent Application No. PCT/JP2013/050157, mailed on Apr. 2, 2013.
(Continued)

*Primary Examiner* — Graham Smith
*Assistant Examiner* — Andrea Lindgren Baltzel
(74) *Attorney, Agent, or Firm* — Keating & Bennett, LLP

(57) ABSTRACT

An antenna device includes a multilayer body as a base body, an antenna coil, and a capacitor chip. The multilayer body includes a magnetic layer including a first main surface and a second main surface, a first non-magnetic layer provided on the first main surface of the magnetic layer, and a second non-magnetic layer provided on the second main surface of the magnetic layer. The antenna coil includes a first coil pattern provided with the first non-magnetic layer and a second coil pattern provided with the second non-magnetic layer. The capacitor chip is connected to the antenna coil and provided on the second non-magnetic layer.

20 Claims, 4 Drawing Sheets

(51) Int. Cl.
  *H01Q 7/06* (2006.01)
  *H01Q 23/00* (2006.01)
  *G06K 19/077* (2006.01)
(58) Field of Classification Search
  USPC .......................................................... 343/788
  See application file for complete search history.

(56) References Cited

FOREIGN PATENT DOCUMENTS

| | | | | |
|---|---|---|---|---|
| JP | 2004-135455 A | 4/2004 | | |
| JP | 2006 319223 | * 11/2006 | ............ | H01F 17/00 |
| JP | 2007-299338 A | 11/2007 | | |
| JP | 2010-263486 A | 11/2010 | | |
| JP | WO2011/118379 A1 | * 9/2011 | ............... | G06K 7/01 |
| JP | 5464306 B2 | 4/2014 | | |
| WO | 2011/118379 A1 | 9/2011 | | |

OTHER PUBLICATIONS

Official Communication issued in corresponding Japenese Patent Application No. 2014-008196, mailed on Sep. 2, 2014.

* cited by examiner

MAGNETIC FIELD

ANTENNA DEVICE ANTENNA MODULE

BACKGROUND OF THE INVENTION

1. Field of the Invention

The present invention relates to antenna devices including a base body which is a multilayer body formed by stacking and unifying a magnetic layer and non-magnetic layers and also relates to antenna modules which include this antenna device as a substrate and an RFIC chip unified with the substrate.

2. Description of the Related Art

Known examples of article identification and management systems include radio frequency identification (RFID) systems in which non-contact communication is performed between a reader/writer and an RFID tag, thereby transmitting information between an RFID system and the RFID tag. In the RFID system, predetermined information is transmitted/received between the RFID tag and the reader/writer.

In general, an antenna device (antenna coil) which uses a coil pattern as a radiation device is employed in an RFID system operating in an HF band represented by the 13.56 MHz band. This antenna coil, as disclosed in, for example, Japanese Unexamined Patent Application Publication No. 2010-263486, includes a planar coil formed on the surface of a flexible substrate and a magnetic sheet bonded to the back surface of the flexible substrate.

However, in the case of the antenna coil disclosed in Japanese Unexamined Patent Application Publication No. 2010-263486, when the diameter of a coil is increased to increase a communication range, the size of an antenna is also increased, and in some cases, a null point may be generated along the center axis of a coil pattern. Further, since a magnetic sheet needs to be bonded to the flexible substrate in this antenna coil, a narrow gap may be generated between the flexible substrate and the magnetic sheet during a bonding process of the magnetic sheet. Then, the antenna characteristics of the antenna coil may be changed. Further, this structure of an antenna coil has a problem in that the flexible substrate and the magnetic sheet, which are originally separate and different members, are only bonded to each other and, hence, the antenna coil may warp or bend, depending on the materials of the substrate and the sheet.

SUMMARY OF THE INVENTION

In view of the above-described situation, preferred embodiments of the present invention provide an antenna device and an antenna module which, although small in size, achieve a long communication range, excellent antenna characteristics, and excellent stability in terms of shape.

An antenna device of the present invention includes a multilayer body including a stacked and unified combination of a magnetic layer including a first main surface and a second main surface, a first non-magnetic layer provided on the first main surface of the magnetic layer, and a second non-magnetic layer provided on the second main surface of the magnetic layer. The first non-magnetic layer includes therein an antenna coil that includes a first coil pattern including a plurality of coil patterns stacked on each other in a stacking direction of the multilayer body.

An antenna module of the present invention includes a multilayer body including a stacked and unified combination of a magnetic layer including a first main surface and a second main surface, a first non-magnetic layer provided on the first main surface of the magnetic layer, and a second non-magnetic layer provided on the second main surface of the magnetic layer; an antenna coil including a first coil pattern that is provided with the first non-magnetic layer and includes a plurality of coil patterns stacked on each other in a stacking direction of the multilayer body; and an RFIC chip that is connected to the antenna coil and is mounted on the second non-magnetic layer.

According to various preferred embodiments of the present invention, an antenna device and an antenna module are provided which, although small in size, achieve a long communication range, excellent antenna characteristics, and excellent stability in terms of shape.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, an antenna device and an antenna module of the present invention will be described on the basis of preferred embodiments of the present invention.

First Preferred Embodiment

An antenna device according to a first preferred embodiment of the present invention preferably is an antenna device on the RFID tag side in an HF band RFID system which utilizes the 13.56 MHz band, and an antenna module of the present preferred embodiment preferably is an RFID tag used in the RFID system.

Figure 1A:
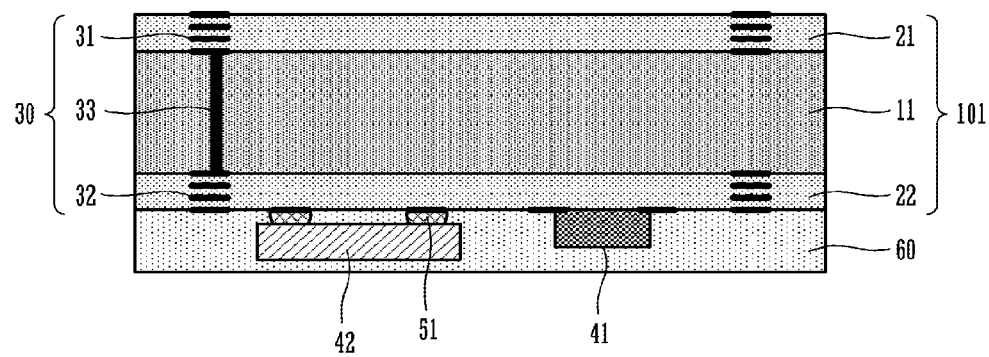
FIG. 1A is a schematic sectional view of an antenna module according to a first preferred embodiment of the present invention and FIG. 1B is a schematic plan view thereof.
Figure 1B:
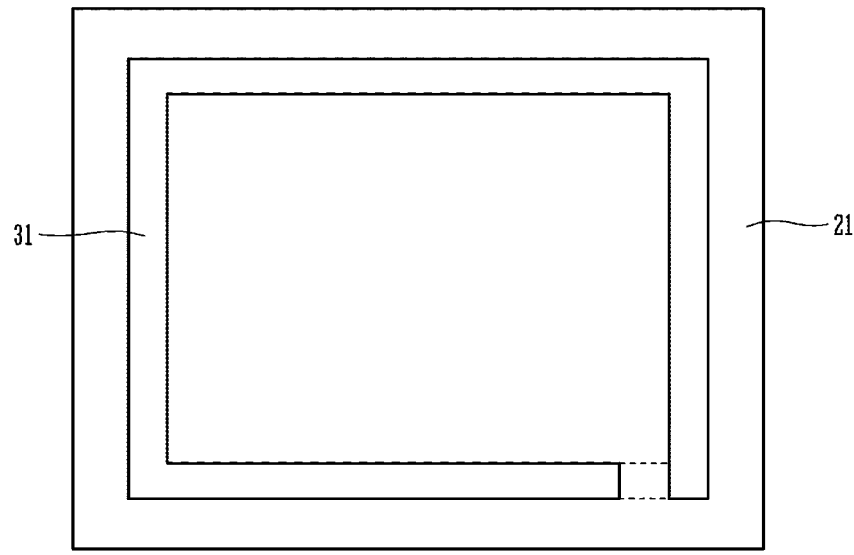

FIG. 1A is a schematic sectional view of the configuration of an antenna module 201 according to the first preferred embodiment and FIG. 1B is a schematic plan view thereof.

Referring to FIGS. 1A and 1B, an antenna device 101 includes a base body which is a multilayer body preferably formed by stacking and unifying a magnetic layer 11 including a first main surface (upper surface in FIG. 1A) and a second main surface (lower surface in FIG. 1A), a first non-magnetic layer 21 provided on the first main surface of the magnetic layer 11, and a second non-magnetic layer 22 provided on the second main surface of the magnetic layer 11. In other words, the base body of the antenna device 101 has a multilayer structure in which, with the magnetic layer 11 as a core layer, the first non-magnetic layer 21 and the second non-magnetic layer 22 preferably having the same or substantially the same thickness are stacked respectively on the first main surface and the second main surface of the magnetic layer 11.

Note that, "stacking and unifying" refers to, in the case where the layers are ceramic layers, co-firing these ceramic layers and refers to, in the case where the layers are resin layers, stacking and press-bonding these resin layers together. Specifically, it is preferable that these layers be unified with no bonding adhesive therebetween and there be no explicit boundary between the magnetic layer and each of the non-magnetic layers (at the interface between the magnetic layer and each of the non-magnetic layers, the layers are in a state in which portions of the materials of the layers have mutually diffused into each other). In this manner, since the magnetic layer 11 and the non-magnetic layers 21 and 22 are stacked and unified, and the non-magnetic layers 21 and 22 are provided on the two main surfaces of the magnetic layer 11, even when the materials (in particular, thermal coefficients of expansion) of the magnetic layer 11 and the non-magnetic layers 21 and 22 are different from each other, gaps are unlikely to form between the layers and a warp or a wave is unlikely to be generated. As a result, the antenna device 101 whose characteristics are unlikely to vary and which has excellent stability in terms of shape is obtained.

Preferably, the magnetic layer 11, the first non-magnetic layer 21, and the second non-magnetic layer 22 are made of low-temperature-sinterable ceramic materials, and are stacked and unified by co-firing. In particular, it is preferable that the magnetic layer 11 be made of a low-temperature-sinterable magnetic ferrite ceramic material and the non-magnetic layers 21 and 22 are made of a low-temperature-sinterable non-magnetic ferrite ceramic material. In this manner, when the magnetic layer 11 and the non-magnetic layers 21 and 22 are formed of ceramic materials which have the same or substantially the same crystal structure (spinel structure), generation of cracks or delamination at the interfaces between the layers are prevented or significantly reduced. Note that the non-magnetic layers 21 and 22 need only have a sufficiently smaller relative magnetic permeability than the magnetic layer 11 and need not necessarily have a relative magnetic permeability of one. Preferably, the relative magnetic permeability of the magnetic layer 11 is 100 or higher and the relative magnetic permeability of the non-magnetic layers 21 and 22 is in the range from 1 to 10, for example.

In the multilayer body described above, a first coil pattern 31 defined by a plurality of coil patterns stacked on each other is provided in the first non-magnetic layer 21. In other words, the first non-magnetic layer 21 is preferably formed by stacking and unifying a plurality of layers each including a coil pattern formed thereon. Since the first coil pattern 31 is a multilayer coil pattern defined by a plurality of coil patterns stacked on each other, a magnetic field is mostly distributed in the axis direction so as to significantly increase the communication range in this direction.

Further, in the multilayer body described above, a second coil pattern 32 defined by a plurality of coil patterns stacked on each other is provided also in the second non-magnetic layer 22. The second non-magnetic layer 22 is also preferably formed by stacking and unifying a plurality of layers each including a coil pattern formed thereon. The first coil pattern 31 and the second coil pattern 32 are connected in series with each other and, hence, the antenna coil is defined by the first coil pattern 31 and the second coil pattern 32. Since these coil patterns 31, 32 each have a coil axis extending in the stacking direction of the magnetic layer 11 and the non-magnetic layers 21 and 22, that is, since the antenna coil has a coil opening that is parallel or substantially parallel with the main surfaces of the magnetic layer 11, a communication range in the axis direction of the coil patterns is further increased.

Preferably, these coil patterns are formed of a low-resistivity metal material mainly made of silver or copper, since such a material has a relatively low conductor loss in high-frequency bands. In addition, by forming each layer with a low-temperature-sinterable ceramic material and forming the coil patterns by printing conductive paste mainly made of silver or copper on low-temperature-sinterable ceramic green sheets, an antenna having a high Q factor is defined by coil patterns having a low conductor resistance.

The first coil pattern 31 and the second coil pattern are connected to each other preferably through a via hole conductor 33 provided in the magnetic layer 11. The first coil pattern 31, the second coil pattern 32, and a via hole conductor 33 define an antenna coil 30. Since the via hole conductor 33 connecting the coil patterns 31 and 32 to each other is provided in the magnetic layer 11 in this manner, this via hole conductor itself functions as an inductor so as to contribute to the increase in the inductance of the antenna coil 30. As a result, although small in size, an antenna coil 201 having a high Q factor is provided.

Figure 2:
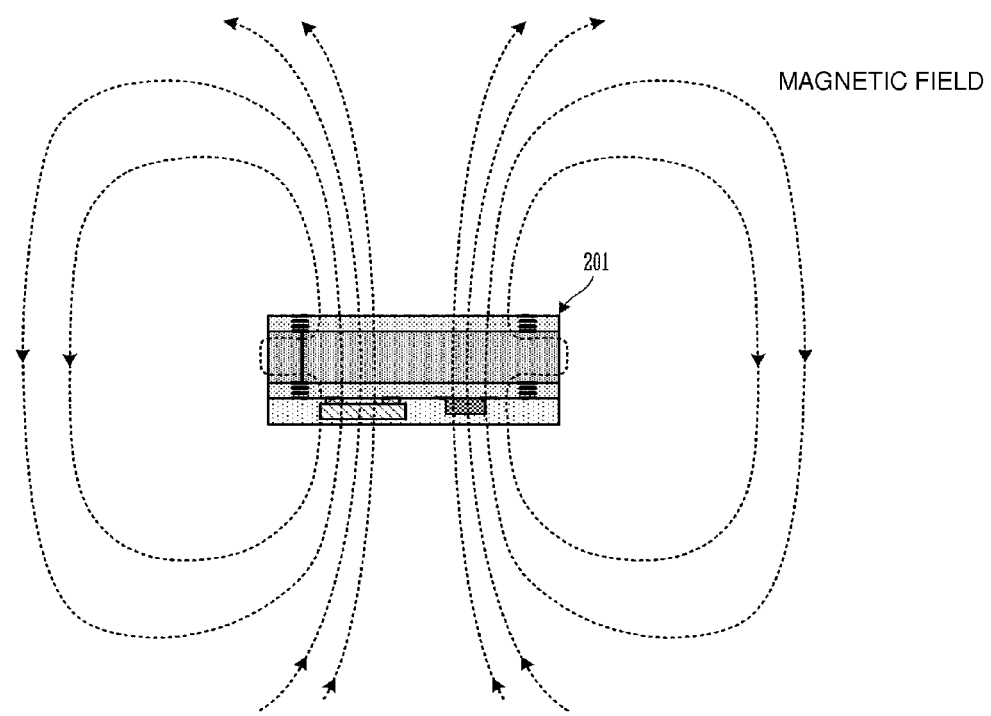
FIG. 2 is a diagram illustrating the magnetic field distribution in the antenna module of the first preferred embodiment of the present invention.

One coil pattern, among the plurality of coil patterns of the first coil pattern 31, is located at the interface between the magnetic layer 11 and the first non-magnetic layer 21. Similarly, one coil pattern, among the plurality of coil patterns defining the second coil pattern 32 is located at the interface between the magnetic layer 11 and the second non-magnetic layer 22. Hence, as illustrated by dotted lines in FIG. 2, as the magnetic field generated by the coil patterns, a magnetic field region arranged to pass through the thickness direction of the magnetic layer and a magnetic field region arranged along the interfaces between the magnetic layer and the non-magnetic layers are generated. When the magnetic field is distributed in this manner, a null point along the winding axis of the coil patterns is unlikely to be generated. In addition, since the first coil pattern 31 and the second coil pattern 32 are arranged to be symmetric about the magnetic layer 11, the magnetic field distribution in the first main surface direction (upward direction) and the magnetic field distribution in the second main surface direction (downward direction) become substantially symmetric with respect to each other, as illustrated in FIG. 2.

In the multilayer body described above, a capacitor chip 41 and an RFIC chip 42 are preferably provided on the surface (lower side in FIG. 1A) of the second non-magnetic layer 22. In other words, surface electrodes to mount the chip components are provided on the surface of the second non-magnetic layer 22, and the chip components are mounted on these surface electrodes preferably via a conductive cement 51, such as solder. These chip components 41, 42 are covered by a sealing resin layer 60 such as an epoxy resin. In this manner, by providing the RFIC chip 42 connected to the antenna coil 30, the antenna module 201 functioning as an RFID tag is provided.

Figure 3:
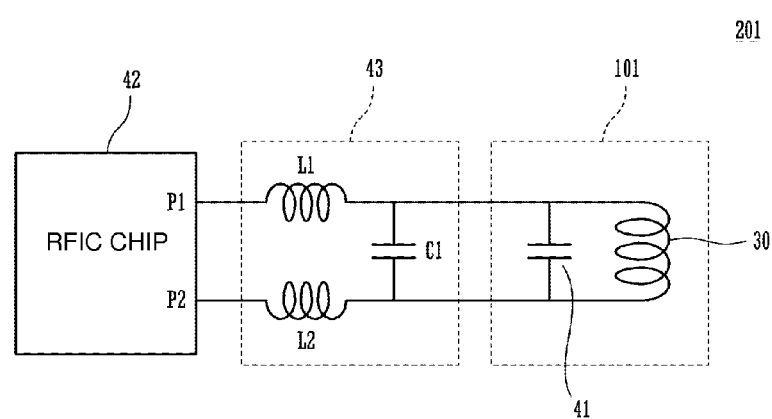
FIG. 3 is an equivalent circuit diagram of the antenna module of the first preferred embodiment of the present invention.

Referring to FIG. 3, the RFIC chip 42 of the antenna module 201 includes two input/output terminals P1 and P2. These input/output terminals define balanced terminals. A filter circuit 43 including inductor elements L1 and L2 and a capacitor element C1 is located between the input/output terminals P1 and P2 and the antenna device 101. The filter circuit 43 is provided to suppress harmonic components generated in the RFIC chip 42.

Note that in the present preferred embodiment, the inductor elements L1 and L2 and the capacitor element C1 of the filter circuit 43 preferably are chip components similarly to the RFIC chip 42 and the capacitor chip 41, and are mounted on the surface of the second non-magnetic layer 22.

Thus, according to the present preferred embodiment, an antenna device is obtained which, although small in size, achieves a long communication range particularly in the stacking direction, makes generation of null points unlikely, and has stable high-frequency characteristics. Further, since the base body, which is the base of the antenna device, has a multilayer structure in which the magnetic layer is sandwiched between the non-magnetic layers, excellent stability in terms of shape is also achieved.

Second Preferred Embodiment

Figure 4:
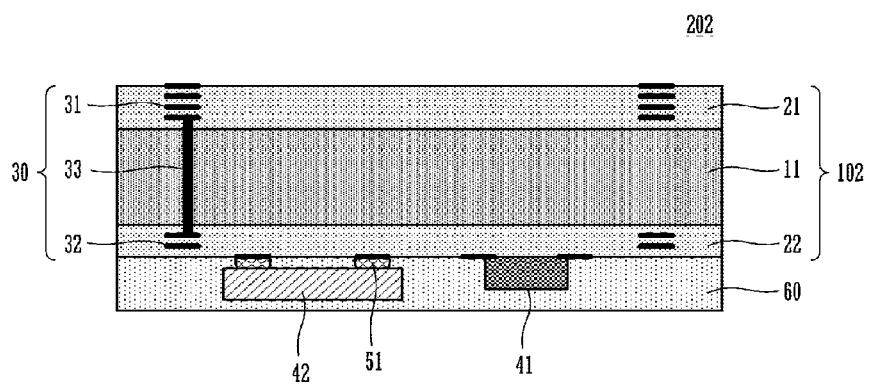
FIG. 4 is a schematic sectional view of an antenna module according to a second preferred embodiment of the present invention.

FIG. 4 is a schematic sectional view of the configuration of an antenna module 202 according to a second preferred embodiment of the present invention.

An antenna device 102 and the antenna module 202 of the second preferred embodiment are basically the same as the antenna device 101 and antenna module 201 of the first preferred embodiment. However, as illustrated in FIG. 4, the first non-magnetic layer 21 has a larger thickness than the second non-magnetic layer 22, and the number of stacked coil pattern layers of the first coil pattern 31 provided in the first non-magnetic layer 21 is larger than the number of stacked coil pattern layers of the second coil pattern 32 provided in the second non-magnetic layer 22. In other words, the first coil pattern 31 and the second coil pattern 32 are not symmetric about the magnetic layer. Further, the first coil pattern 31 and the second coil pattern 32 do not include respective coil patterns provided at the interfaces between the magnetic layer and the non-magnetic layers.

Figure 5:
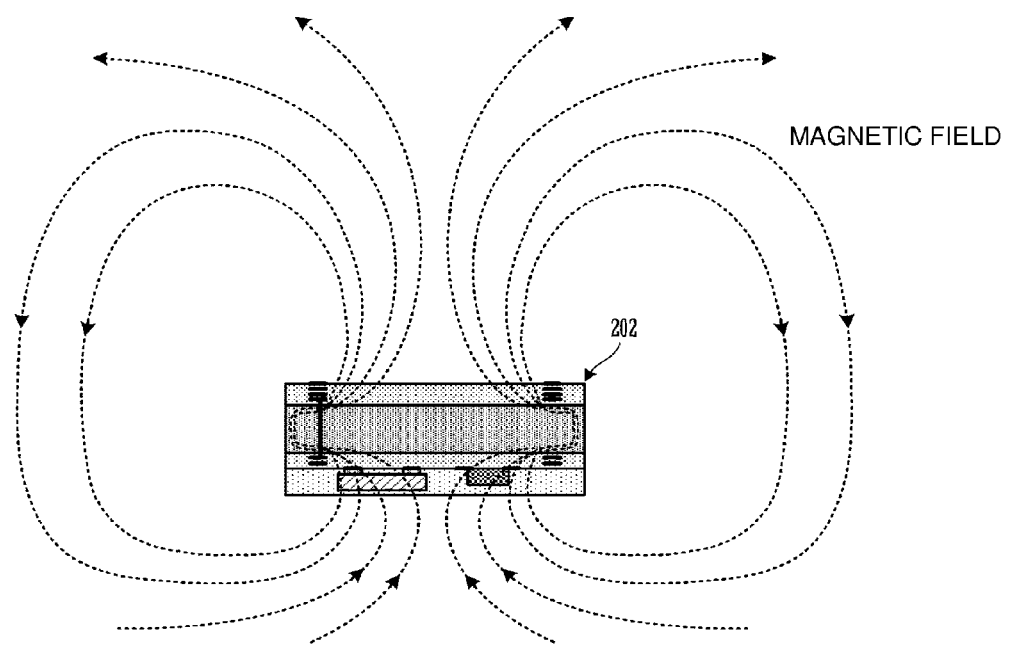
FIG. 5 is a diagram illustrating the magnetic field distribution in the antenna module of the second preferred embodiment of the present invention.

As a result, as illustrated in FIG. 5, the direction of a magnetic field generated by the antenna module 202 changes at the interfaces between the magnetic layer and the non-magnetic layers, and magnetic lines of flux extend along the interfaces between the magnetic layer and the non-magnetic layers. In addition, the magnetic field distribution area in the upward direction becomes wider than in the downward direction. In other words, the maximum communication range in the upward direction is made longer than that in the downward direction such that the antenna device has directivity.

Third Preferred Embodiment

Figure 6A:
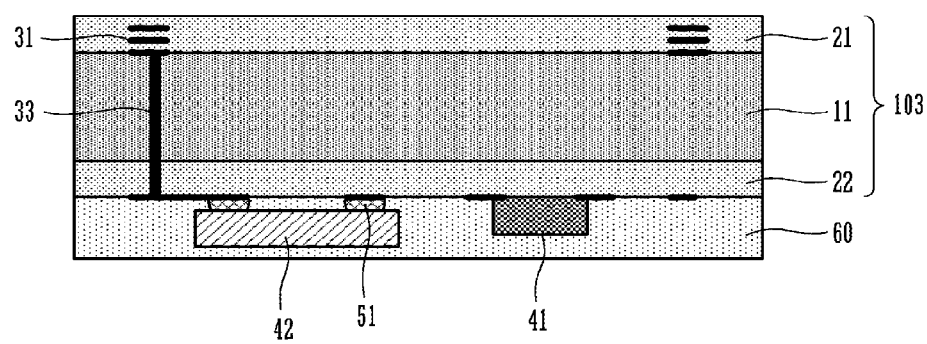
FIG. 6A is a schematic sectional view of an antenna module according to a third preferred embodiment of the present invention and FIG. 6B is a schematic bottom surface view thereof.
Figure 6B:
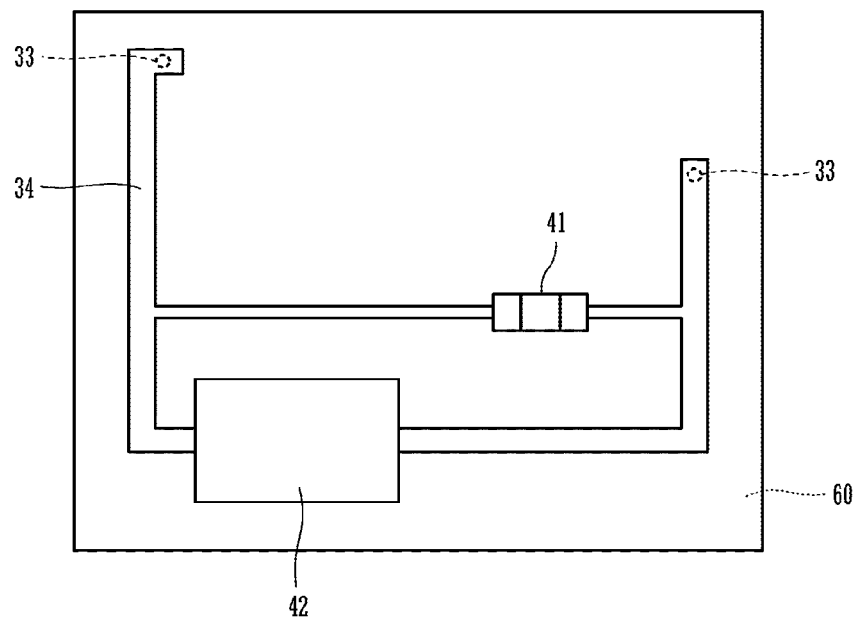

FIGS. 6A and 6B are schematic diagrams illustrating the configuration of an antenna module 203 according to a third preferred embodiment of the present invention.

An antenna device 103 and the antenna module 203 of the third preferred embodiment are basically the same as the respective antenna device 101 and antenna module 201 of the first preferred embodiment. However, as illustrated in FIGS. 6A and 6B, the antenna device 103 does not include the second coil pattern in the second non-magnetic layer 22. Instead of including the second coil pattern, the second non-magnetic layer 22 includes a surface layer pattern 34 provided on the surface layer thereof to connect the first coil pattern 31 to the RFIC chip 42 and the capacitor chip 41. A first end of the surface layer pattern 34 is connected to a first end of the first coil pattern 31, and the second end of the surface layer pattern 34 is connected to a first end of the capacitor chip 41. The second end of the capacitor chip 41 is connected to the second end of the first coil pattern 31. The surface layer pattern 34, when viewed in the stacking direction (viewed in plan), is patterned so as to be superposed with the first coil pattern 31. As a result, the surface layer pattern 34 can be thought to be the second coil pattern. Note that the illustration of the inductor chip and capacitor defining the filter circuit is omitted.

In the third preferred embodiment, the first coil pattern 31 is connected to the RFIC chip 42 through the via hole conductor 33 provided in the magnetic layer 11. In other words, the via hole conductor 33 not only contributes to the increase in the inductance of the antenna coil but also itself functions as an inductor element and defines a portion of the inductor element of the filter circuit.

Other Preferred Embodiments

A number of specific preferred embodiments of the present invention have been described above. However, the present invention is not limited to these preferred embodiments.

For example, the antenna device of the present invention is not limited to the antenna device of an RFID tag, and can be applied to the antenna device of, for example, a reader/writer. Further the present invention can also be applied to the antenna devices of other communication systems in LF bands, HF bands, UHF bands, and the like, such as a near field communication (NFC) system.

The first coil pattern and the second coil pattern may be connected in series or connected in parallel with each other. When they are connected in parallel, a DC current resistance (DCR) is decreased such that the Q factor of the antenna coil is increased. Portions of these coil patterns may be provided in the magnetic layer. Further, additional coil patterns other than these coil patterns may be included.

The capacitor chip of the antenna device and the capacitor chip of the filter circuit are preferably mounted on the surface of the second non-magnetic layer, but may be integrated in the inner layers of the second non-magnetic layer as capacitor patterns. Further, the inductor elements defining a portion of the filter circuit may be mounted on the surface of the second non-magnetic layer as inductor chips, but may be integrated in the magnetic layer as coil patterns. In particular, when the inductor elements are integrated in the magnetic layer, magnetic coupling of the coil patterns via a magnetic substance becomes strong such that the self-impedance of the coil is increased and the coil is reduced in size.

The via conductor, which functions as an interlayer connection conductor, may be a via hole conductor of a type in which a conductive material is filled in a hole for the via hole conductor, but may be a via hole conductor of a type (through hole conductor) in which a plating film is formed on the inner surface of a through hole.

The antenna device and the antenna module according to various preferred embodiments of the present invention are useful as an antenna device and an antenna module for an RFID system and, in particular, as an antenna device and an antenna module for an HF band RFID system, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
   a multilayer body including a stacked and unified combination of a magnetic layer including a first main surface and a second main surface, a first non-magnetic layer provided on the first main surface of the magnetic layer, and a second non-magnetic layer provided on the second main surface of the magnetic layer; and
   a via hole conductor extending through the magnetic layer from the first non-magnetic layer to the second non-magnetic layer; wherein
   the first non-magnetic layer includes therein an antenna coil that includes a first coil pattern including a plurality of coil patterns stacked on each other in a stacking direction of the multilayer body;
   the antenna coil includes a second coil pattern located in the second non-magnetic layer; and
   the magnetic layer includes a magnetic material.

2. The antenna device according to claim 1, wherein the first coil pattern and the second coil pattern are not symmetric about the magnetic layer.

3. The antenna device according to claim 1, further comprising a capacitor that is connected to the antenna coil and is provided on a surface layer or an inner layer of the second non-magnetic layer.

4. The antenna device according to claim 1, wherein the magnetic layer, the first non-magnetic layer, and the second non-magnetic layer are made of a low-temperature-sinterable ceramic material and are stacked and unified by co-firing.

5. The antenna device according to claim 1, wherein the first non-magnetic layer has a larger thickness than the second non-magnetic layer, and a number of stacked coil pattern layers of the first coil pattern provided with the first non-magnetic layer is larger than a number of stacked coil pattern layers of the second coil pattern provided with the second non-magnetic layer.

6. The antenna device according to claim 1, wherein the antenna device is configured for use in a RFID system.

7. The antenna device according to claim 1, wherein the first non-magnetic layer and the second non-magnetic layer have the same or substantially the same thickness.

8. The antenna device according to claim 1, wherein the magnetic layer and the first and second non-magnetic layers are made of ceramic materials which have the same or substantially the same crystal structure.

9. The antenna device according to claim 1, wherein a relative magnetic permeability of the magnetic layer is 100 or higher and a relative magnetic permeability of the first and second non-magnetic layers is in a range from 1 to 10.

10. The antenna device according to claim 1, wherein the first and second coil patterns each have a coil axis extending in the stacking direction.

11. The antenna device according to claim 1, further comprising a via hole conductor located in the magnetic layer and arranged to connect the first and second coil patterns.

12. The antenna device according to claim 1, further comprising a RFIC chip and a capacitor chip provided on the second non-magnetic layer.

13. The antenna device according to claim 12, further comprising a sealing resin arranged to seal the RFIC chip and the capacitor chip on the second non-magnetic layer.

14. An antenna module comprising:
    a multilayer body including a stacked and unified combination of a magnetic layer including a first main surface and a second main surface, a first non-magnetic layer provided on the first main surface of the magnetic layer, and a second non-magnetic layer provided on the second main surface of the magnetic layer;
    a via hole conductor extending through the magnetic layer from the first non-magnetic layer to the second non-magnetic layer;
    an antenna coil including a first coil pattern that is provided with the first non-magnetic layer and includes a plurality of coil patterns stacked on each other in a stacking direction of the multilayer body; and
    an RFIC chip that is connected to the antenna coil and is provided on the second non-magnetic layer; wherein
    the antenna coil includes a second coil pattern located in the second non-magnetic layer; and
    the magnetic layer includes a magnetic material.

15. An antenna device comprising:
    a multilayer body including a stacked and unified combination of a magnetic layer including a first main surface and a second main surface, a first non-magnetic layer provided on the first main surface of the magnetic layer, and a second non-magnetic layer provided on the second main surface of the magnetic layer; wherein
    the first non-magnetic layer includes therein an antenna coil that includes a first coil pattern including a plurality of coil patterns stacked on each other in a stacking direction of the multilayer body;
    a via hole conductor is connected to the first coil pattern and extends through the magnetic layer from the first non-magnetic layer to the second non-magnetic layer; and
    the magnetic layer includes a magnetic material.

16. The antenna device according to claim 15, wherein the antenna coil includes a second coil pattern located in the second non-magnetic layer.

17. The antenna device according to claim 15, wherein the first coil pattern and the second coil pattern are not symmetric about the magnetic layer.

18. The antenna device according to claim 15, further comprising a capacitor that is connected to the antenna coil and is provided on a surface layer or an inner layer of the second non-magnetic layer.

19. The antenna device according to claim 1, wherein the magnetic layer, the first non-magnetic layer, and the second non-magnetic layer are made of a low-temperature-sinterable ceramic material and are stacked and unified by co-firing.

20. The antenna device according to claim 15, wherein the first non-magnetic layer has a larger thickness than the second non-magnetic layer, and a number of stacked coil pattern layers of the first coil pattern provided with the first non-magnetic layer is larger than a number of stacked coil pattern layers of the second coil pattern provided with the second non-magnetic layer.

* * * * *